US010452966B2

United States Patent
Kanda et al.

(10) Patent No.: US 10,452,966 B2
(45) Date of Patent: Oct. 22, 2019

(54) SENSOR DEVICE FOR WEARABLE DEVICE GENERATING POWER-ON TRIGGER SIGNAL

(71) Applicant: FUJITSU LIMITED, Kawasaki-shi, Kanagawa (JP)

(72) Inventors: Kouichi Kanda, Chofu (JP); Shoichi Masui, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/729,864

(22) Filed: Oct. 11, 2017

(65) Prior Publication Data

US 2018/0121779 A1    May 3, 2018

(30) Foreign Application Priority Data

Oct. 28, 2016   (JP) .................. 2016-212046

(51) Int. Cl.
| | |
|---|---|
| G06K 19/02 | (2006.01) |
| G06K 19/077 | (2006.01) |
| H01L 23/00 | (2006.01) |
| H01R 12/70 | (2011.01) |
| G06K 19/07 | (2006.01) |

(52) U.S. Cl.
CPC ....... *G06K 19/07718* (2013.01); *G06K 19/02* (2013.01); *G06K 19/0716* (2013.01); *G06K 19/0723* (2013.01); *G06K 19/07749* (2013.01); *H01L 24/45* (2013.01); *H01R 12/7005* (2013.01); *H01L 2924/10253* (2013.01); *H01L 2924/14* (2013.01); *H01L 2924/15313* (2013.01); *H01L 2924/181* (2013.01); *H01L 2924/3025* (2013.01); *H01L 2924/30107* (2013.01)

(58) Field of Classification Search
CPC .................. G04G 21/025; G04G 21/04
See application file for complete search history.

(56) References Cited

U.S. PATENT DOCUMENTS

| | | | | |
|---|---|---|---|---|
| 6,434,603 | B1 * | 8/2002 | Tsuji | G06Q 10/10 709/203 |
| 6,619,835 | B2 * | 9/2003 | Kita | A44C 5/0015 368/10 |
| 6,809,952 | B2 * | 10/2004 | Masui | G06K 7/0008 365/145 |
| 7,003,680 | B2 * | 2/2006 | Masui | G06K 19/0701 235/492 |
| 7,181,179 | B2 * | 2/2007 | Fujisawa | G04G 21/04 455/127.1 |

(Continued)

FOREIGN PATENT DOCUMENTS

| | | |
|---|---|---|
| JP | 2002-152145 | 5/2002 |
| JP | 2006-195730 | 7/2006 |

(Continued)

*Primary Examiner* — Harshad R Patel
*Assistant Examiner* — Tran M. Tran
(74) *Attorney, Agent, or Firm* — Fujitsu Patent Center

(57) ABSTRACT

A sensor device includes: a first portion that is formed of an inorganic semiconductor material, includes a control module, and is reusable; a second portion that is formed of an organic material and separably coupled to the first portion; and a sensor that is disposed in at least one of the first and second portions.

14 Claims, 12 Drawing Sheets

(56) References Cited

U.S. PATENT DOCUMENTS

| | | | |
|---|---|---|---|
| 7,618,260 B2* | 11/2009 | Daniel | A44C 5/0007 24/311 |
| 7,914,468 B2* | 3/2011 | Shalon | A61B 5/0006 600/590 |
| 8,569,809 B2* | 10/2013 | Thomas | G01L 1/146 257/252 |
| 8,618,930 B2* | 12/2013 | Papadopoulos | A61B 5/02427 340/539.12 |
| 8,725,842 B1* | 5/2014 | Al-Nasser | G04G 17/08 709/219 |
| 8,787,006 B2* | 7/2014 | Golko | G06F 1/163 361/679.03 |
| 8,821,415 B2* | 9/2014 | Al-Ali | A61B 7/003 600/586 |
| 9,017,256 B2* | 4/2015 | Gottesman | A61B 5/486 600/300 |
| 9,143,202 B2* | 9/2015 | Symons | H02J 7/025 |
| 9,282,893 B2* | 3/2016 | Longinotti-Buitoni | A61B 5/6804 |
| 9,283,399 B2* | 3/2016 | Donnelly | A61B 5/02055 |
| 9,292,008 B1* | 3/2016 | Ahamed | G06F 1/163 |
| 9,380,949 B2* | 7/2016 | Schuessler | A61B 5/02055 |
| 9,448,755 B2* | 9/2016 | Francis | G06F 3/1423 |
| 9,465,365 B2* | 10/2016 | Nichol | G04B 47/063 |
| 9,646,184 B2* | 5/2017 | Jiang | G06K 7/10396 |
| 9,659,290 B2* | 5/2017 | Dittmer | G06Q 20/10 |
| 9,680,831 B2* | 6/2017 | Jooste | G06F 1/163 |
| 9,709,960 B2* | 7/2017 | Cho | G04R 20/00 |
| 9,737,262 B2* | 8/2017 | Donnelly | A61B 5/02055 |
| 9,740,906 B2* | 8/2017 | AlNasser | G06K 7/10009 |
| 9,766,589 B2* | 9/2017 | Lee | G04B 37/1486 |
| 9,786,981 B2* | 10/2017 | Mahanfar | H01Q 1/273 |
| 9,814,108 B2* | 11/2017 | Wang | H01F 38/14 |
| 9,836,083 B2* | 12/2017 | Ricci | G06F 1/163 |
| 9,836,900 B2* | 12/2017 | Jun | G07C 9/00119 |
| 9,886,058 B2* | 2/2018 | Zaitsev | G06F 1/163 |
| 9,886,111 B2* | 2/2018 | Wei | G06F 3/041 |
| 9,949,691 B2* | 4/2018 | Huppert | A61B 5/6833 |
| 9,956,392 B2* | 5/2018 | Kaib | A61N 1/046 |
| 10,034,351 B2* | 7/2018 | Kim | F21V 23/06 |
| 10,191,455 B2* | 1/2019 | Shim | G04G 21/02 |
| 10,284,763 B2* | 5/2019 | Kim | G06F 13/14 |
| 2002/0148110 A1 | 10/2002 | Blanc et al. | |
| 2003/0174049 A1* | 9/2003 | Beigel | G06K 19/0716 340/10.42 |
| 2005/0055479 A1 | 3/2005 | Zer et al. | |
| 2008/0057868 A1* | 3/2008 | Chang | H04M 1/6058 455/41.2 |
| 2012/0203076 A1* | 8/2012 | Fatta | A61B 5/681 600/300 |
| 2013/0002538 A1* | 1/2013 | Mooring | G06F 1/163 345/156 |
| 2013/0317333 A1* | 11/2013 | Yang | A61B 5/00 600/372 |
| 2014/0074308 A1 | 3/2014 | Washiro et al. | |
| 2014/0375465 A1* | 12/2014 | Fenuccio | G08B 5/36 340/691.1 |
| 2015/0092520 A1* | 4/2015 | Robison | G04G 21/02 368/9 |
| 2015/0157220 A1* | 6/2015 | Fish | A61B 5/02055 600/301 |
| 2015/0186705 A1* | 7/2015 | Magi | G06K 9/0002 382/125 |
| 2015/0194817 A1* | 7/2015 | Lee | G01N 33/00 73/61.41 |
| 2015/0366050 A1* | 12/2015 | Noh | H05K 1/147 361/749 |
| 2016/0187857 A1* | 6/2016 | Cho | G04R 20/00 368/47 |
| 2017/0331505 A1* | 11/2017 | Shim | H04B 1/385 |
| 2018/0129831 A1* | 5/2018 | Yokoi | G06F 21/32 |
| 2018/0132738 A1* | 5/2018 | Choi | H01M 2/1066 |
| 2018/0210491 A1* | 7/2018 | Song | G06F 1/163 |
| 2018/0283913 A1* | 10/2018 | Chen | G01D 18/00 |

FOREIGN PATENT DOCUMENTS

| | | |
|---|---|---|
| JP | 2007-518160 | 7/2007 |
| JP | 2009-259258 | 11/2009 |
| JP | 2013-141401 | 7/2013 |

* cited by examiner

METAL PLATE

METAL WIRING

TO NON-CONTACT IF CIRCUIT

SENSOR DEVICE FOR WEARABLE DEVICE GENERATING POWER-ON TRIGGER SIGNAL

CROSS-REFERENCE TO RELATED APPLICATION

This application is based upon and claims the benefit of priority of the prior Japanese Patent Application No. 2016-212046, filed on Oct. 28, 2016, the entire contents of which are incorporated herein by reference.

FIELD

The embodiments discussed herein are related to a sensor device.

BACKGROUND

With the increasing interest in individual's health management, wearable biometric information sensors or health management applications have been distributed. Further, there have been released products in which a wearable sensor such as a wristband type wearable sensor and an application equipped in a smart phone or the like cooperate with each other to record and manage health conditions such as body temperature, blood pressure, and heart rate. The information acquired by the wearable sensor is wirelessly transmitted to a smart phone or a personal computer.

Related technologies are disclosed in, for example, Japanese Laid-Open Patent Publication Nos. 2007-518160 and 2009-259258.

SUMMARY

One aspect of the embodiments, a sensor device includes: a first portion that is formed of an inorganic semiconductor material, includes a control module, and is reusable; a second portion that is formed of an organic material and separably coupled to the first portion; and a sensor that is disposed in at least one of the first and second portions.

The object and advantages of the disclosure will be realized and attained by means of the elements and combinations particularly pointed out in the claims. It is to be understood that both the foregoing general description and the following detailed description are exemplary and explanatory and are not restrictive of the disclosure, as claimed.

DESCRIPTION OF EMBODIMENTS

For example, a removable electronic circuit card having an input/output module including an antenna and a memory module is provided. Further, for example, a disposable chip electronic device including an antenna type interface is provided.

A sensor device that detects health conditions, environment conditions and others may have a part required to be frequently replaced. For example, in a sensor used for measuring biometric information, a portion directly contacting the skin may be repeatedly replaced desirably. In an environment sensor installed in the outdoors, a portion that is easily deteriorated by an external stimulus may be repeatedly replaced desirably.

A configuration in which a portion of a sensor device may be easily replaced at a low cost may be provided.

In an aspect, a sensor device includes: a first portion that is formed of an inorganic semiconductor material, includes a control module, and is reusable; a second portion that is formed of an organic material and separably connected to the first portion; and a sensor that is disposed in at least one of the first and second portions.

A portion of the sensor device may be easily replaced at a low cost.

In an embodiment, a sensor device is formed with a first portion and a second portion that are separable from each other. The first portion that is stationarily or repeatedly used is manufactured by using an inorganic semiconductor material, and the second portion that is replaceable is manufactured by using an inexpensive flexible organic semiconductor. The sensor is provided in at least one of the first and second portions. With this configuration, a portion of the sensor device may be easily replaced at a low cost.

As a specific example, main components such as a power supply and a control circuit are disposed in the first portion, and a trigger circuit that triggers the start of the operation of the sensor device is disposed in the second portion. Accordingly, power consumption of the sensor device may be reduced.

Figure 1:
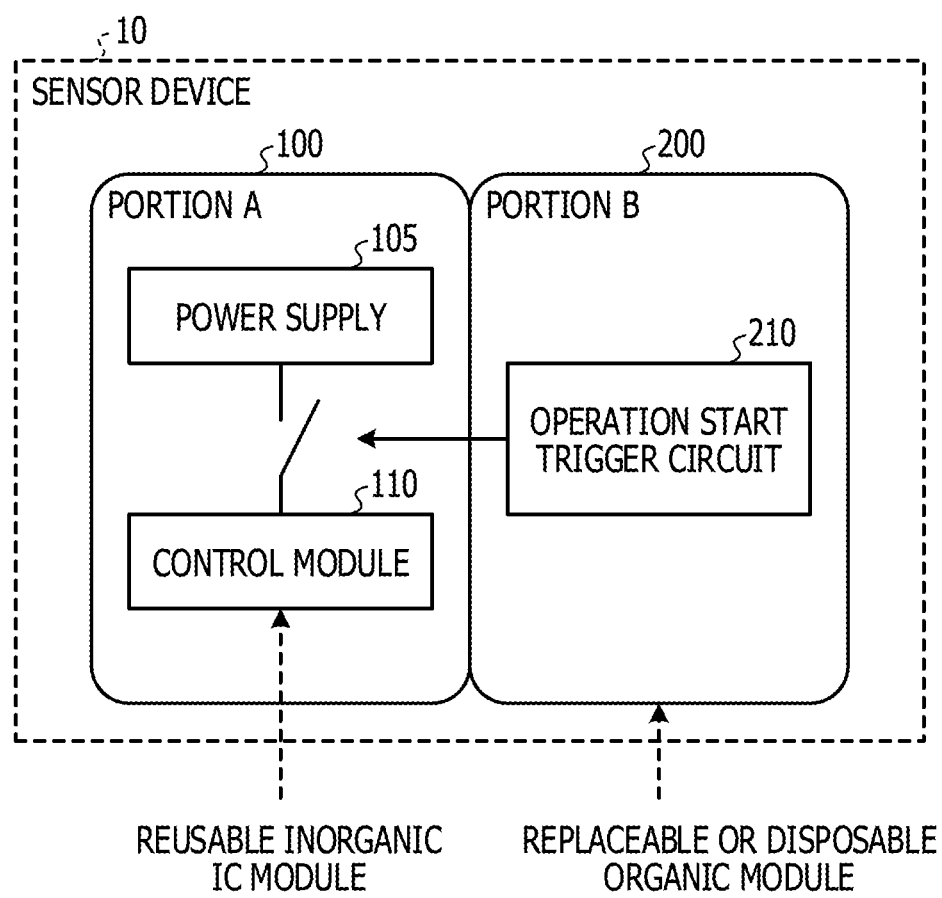
FIG. 1 is a view illustrating one example of a sensor device according to an embodiment.

FIG. 1 is a view illustrating an example of a sensor device 10 according to an embodiment. The sensor device 10 includes a first portion (indicated as "Portion A" in FIG. 1) 100 formed of an inorganic semiconductor chip and a second portion (indicated as "Portion B" in FIG. 1) 200 formed of an organic semiconductor, and the first portion 100 and the second portion 200 may be separated from each other.

The first portion 100 is a reusable integrated circuit (IC) module and includes a power supply 105 and a control module 110. The second portion 200 is a replaceable or disposable module formed using an organic semiconductor material by a printing method or the like. The second portion 200 includes an operation start trigger circuit 210 and generates an output signal for operating the first portion by an external stimulus. The first portion 100 starts its operation by the output signal from the second portion 200.

When the sensor device 10 is used in a medical institution or the like, the portion contacting the skin may be replaced for each patient desirably. When the sensor device 10 is a personal biometric sensor, the portion contacting the skin may be replaced desirably because dirt caused by sweat, secretion or the like may be attached to the portion. When the second portion 200 formed of the flexible organic material is used as a disposable module that is easily separated from the first portion 100, the sensor device 10 may be kept clean, and the lifetime thereof may be lengthened. Even when the sensor device 10 is an environment sensor used in the outdoor, the stable operation and the lifetime of the sensor may be maintained by using a portion directly exposed to the environment as the second portion 200 that is replaceable or disposable.

Figure 2:
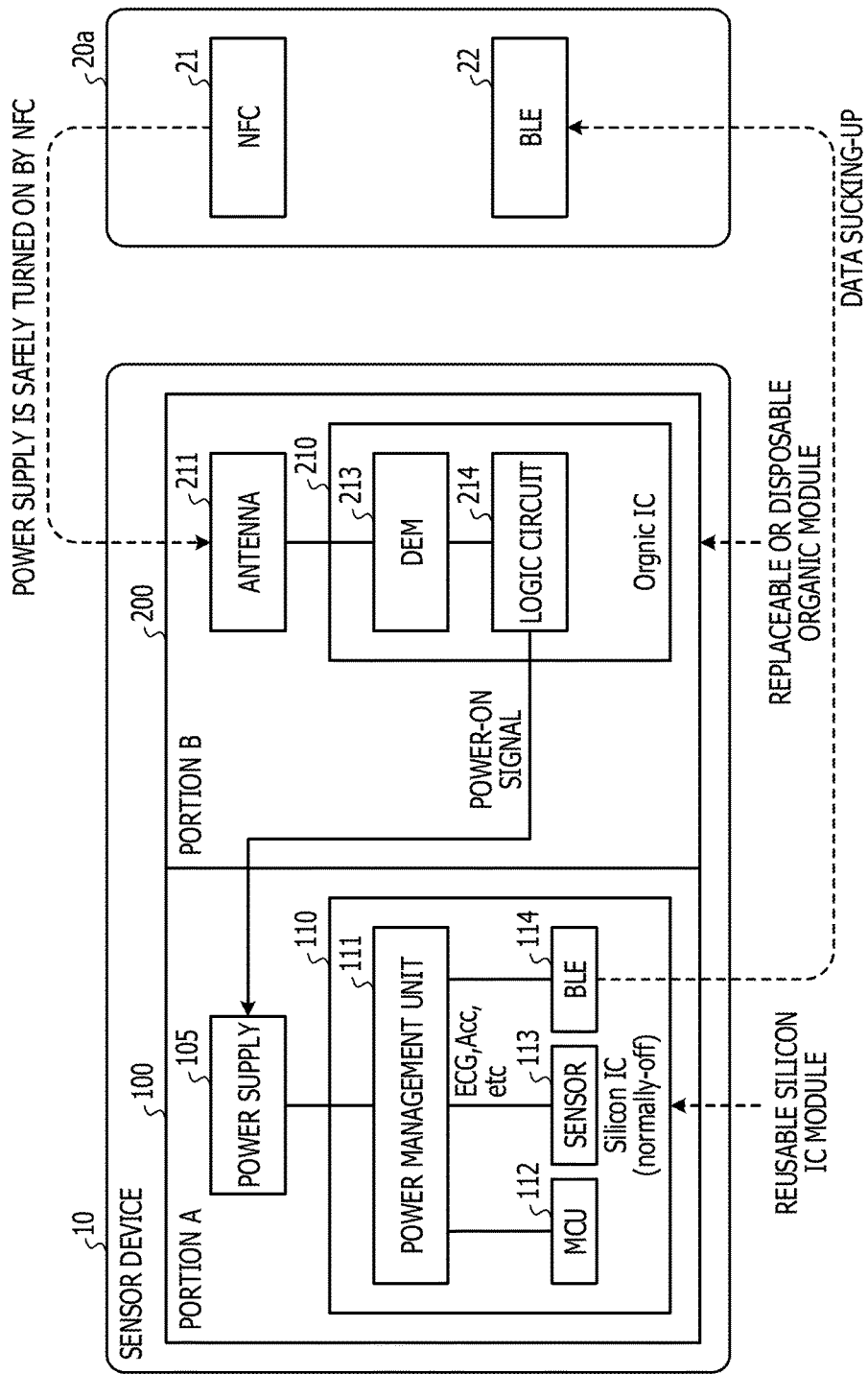
FIG. 2 is a view illustrating an exemplary operation form of the sensor device of FIG. 1.

FIG. 2 is a conceptual view illustrating an exemplary operation form of the sensor device 10 of FIG. 1. The sensor device 10 transmits and receives sensor information in cooperation with a terminal 20a such as a smart phone. In the example of FIG. 2, the control module 110 of the first portion 100 is formed of a silicon IC and is in a normally-off state. The control module 110 includes a power management unit 111, a microcontroller (MCU) 112, a sensor 113, and a communication module 114. The sensor 113 measures biometric information such as the electrocardiogram (ECG), acceleration (ACC) of the limb, the body temperature, the heart rate, and the blood pressure, or environment information such as a temperature, humidity, noise, ultraviolet rays, and a harmful substance concentration. The communication module 114 conducts a short distance wireless communication by a wireless communication protocol, for example, Bluetooth Low Energy (BLE). The second portion 200 of the sensor device 10 includes an antenna 211 and an operation start trigger circuit 210 by an organic IC. The operation start trigger circuit 210 includes a demodulator (DEM) 213 and a logic circuit 214.

The sensor device 10 starts its operation as the terminal 20a approaches to the proximity. For example, a reception of a signal from the terminal 20a through a near field communication becomes an external stimulus that operates the sensor device 10. The terminal 20a includes a first wireless communication module 21 that conducts a near field (non-contact) communication with the second portion 200 of the sensor device 10 by a wireless communication protocol, for example, a Near Field Communication (NFC), and a second wireless communication module 22 that conducts a short distance communication with the first portion 100 of the sensor device 10 by a wireless communication protocol, for example, the BLE.

When a user causes the terminal 20a to touch the sensor device 10 or holds the terminal 20a over the sensor device 10, the power supply 105 of the sensor device 10 is turned on. More specifically, a signal transmitted from the first wireless communication module 21 of the terminal 20a is propagated to the antenna 211 of the second portion 200 of the sensor device 10 by, for example, the NFC and demodulated by the demodulator 213 to be input to the logic circuit 214. The logical circuit 214 compares ID information included in the signal from the terminal 20a and ID information of the sensor device 10 with each other, and when the ID information included in the signal from the terminal 20a and the ID information of the sensor device 10 are consistent with each other, the logic circuit 214 generates a trigger signal (e.g., a power-on signal) and outputs the trigger signal to the first portion 100.

In the first portion 100, the power supply 105 is turned on by the input of the power-on signal, and the operation of the first portion 100 is started. The power from the power supply 105 is supplied to the MCU 112, the sensor 113, and the communication module 114 by the power management unit 111. The sensor 113 starts sensing and acquires biometric information of the user. The acquired biometric information is wirelessly transmitted to the terminal 20a by the communication module 114.

Pairing and authentication are performed by the near field communication such as the NFC, and transmission/reception of the sensor information is performed by the short distance wireless communication such as the BLE. Since only a person authorized to use the terminal 20a may power ON the sensor device 10 in the non-contact manner, security is ensured. Further, the biometric information may be measured and acquired at a timing requested by the user. Since a wakeup receiver which is always turned on needs not be provided in the sensor device 10, battery consumption is zero when the sensor device 10 is not in use. Since the communication distance between the sensor device 10 and the terminal 20a is short, the request for resistance against disturbance (interference) waves is reduced, and the operation start trigger circuit 210 formed of an organic circuit may be simplified.

The second portion 200 formed of an organic material may be flexible and disposable. When an adhesive layer is formed on the surface of the second portion 200, the adhesive layer may be used as a "seal" for mounting the sensor 113 provided in the first portion 100 on an object to be sensed. The sensor device 10 may be attached to the body surface of a human body with the first portion facing inward.

Figure 3:
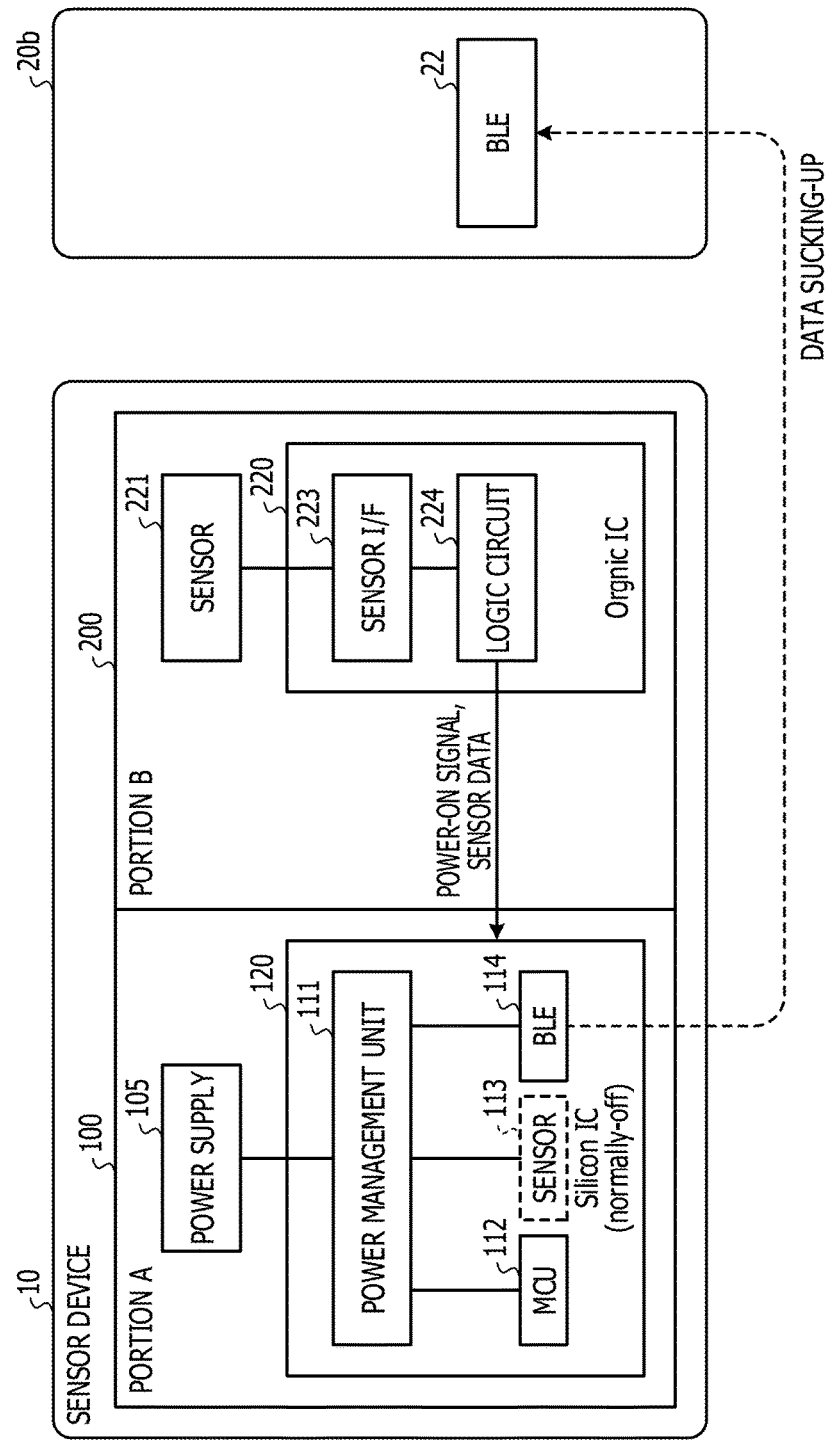
FIG. 3 is a view illustrating another exemplary operation form of the sensor device of FIG. 1.

FIG. 3 is a view illustrating another exemplary operation form of the sensor device 10 of FIG. 1. The sensor device 10 transmits and receives sensor information in cooperation with the terminal 20a such as a smart phone. In the example of FIG. 3, a sensor 221 is disposed in the second portion 200 formed of an organic material, and a predetermined level of sensor information measured by the sensor 221 serves as a trigger that operates the first portion 100.

The first portion 100 of the sensor device 10 includes the power supply 105 and a control module 120. The control module 120 is formed of a silicon IC and is in the normally-off state. The control module 120 includes the power management unit 111, the MCU 112, and the communication module 114 that conducts a short distance wireless communication according to a standard such as BLE.

The second portion 200 of the sensor device 10 includes the sensor 221 and an operation start trigger circuit 220 as an organic IC. The operation start trigger circuit 220 includes a sensor interface (I/F) circuit 222 and a logic circuit 224. The sensor interface circuit 222 includes, for example, an A/D converter, an oscillator or the like, and converts the output of the sensor 221 into digital information that may be used in the logic circuit 224.

The operation of the sensor device 10 is turned on when sensor information exceeding a predetermined level is measured by the sensor 221. For example, a change of the state of an object to be sensed into the state exceeding a predetermined level becomes an external stimulus that operates the sensor device 10. In a case where the sensor 221 is a heart rate sensor, the logic circuit 224 generates and supplies a power-on signal to the first portion 100 when the heart rate exceeds a predetermined value. Similarly, in a case where the sensor 221 is a biometric sensor such as a perspiration sensor, a body temperature sensor, or a blood pressure sensor, or a temperature sensor, a concentration sensor, a noise sensor or the like that is used for quality control and environment monitoring, the power-on signal is output when a measurement value exceeding a predetermined level is detected. The sensor data measured by the sensor 221 is output to the first portion 100 simultaneously with the power-on signal or after an elapse of a predetermined time.

In the first portion 100, the power supply 105 is turned on by the input of the power-on signal, and the operation of the first portion 100 is started. The power from the power supply 105 is supplied to the MCU 112 and the communication module 114 by the power management unit 111. The communication module 114 wirelessly transmits the sensor data received from the second portion 200, to a terminal 20b.

With the configuration described above, since the power supply is turned on only when a notification of the sensor information is necessary and the sensor information is transmitted to the terminal 20b, the power consumption may be reduced. Since pairing, authentication, and the transmission/reception of the sensor information are performed through the BLE, the security is ensured.

In addition, the sensor 113 within the control module 120 of the first portion 100 may be provided as a second sensor as indicated by a dashed line. For example, the power supply of the first portion 100 may be turned on to initiate the measurement of the heart rate by detecting a perspiration in the sensor 221 as a trigger. An element related to the state change detected by the sensor 221 is measured by the sensor 113 of the first portion 100 so that meaningful information may be collected with low power consumption.

Figure 4:
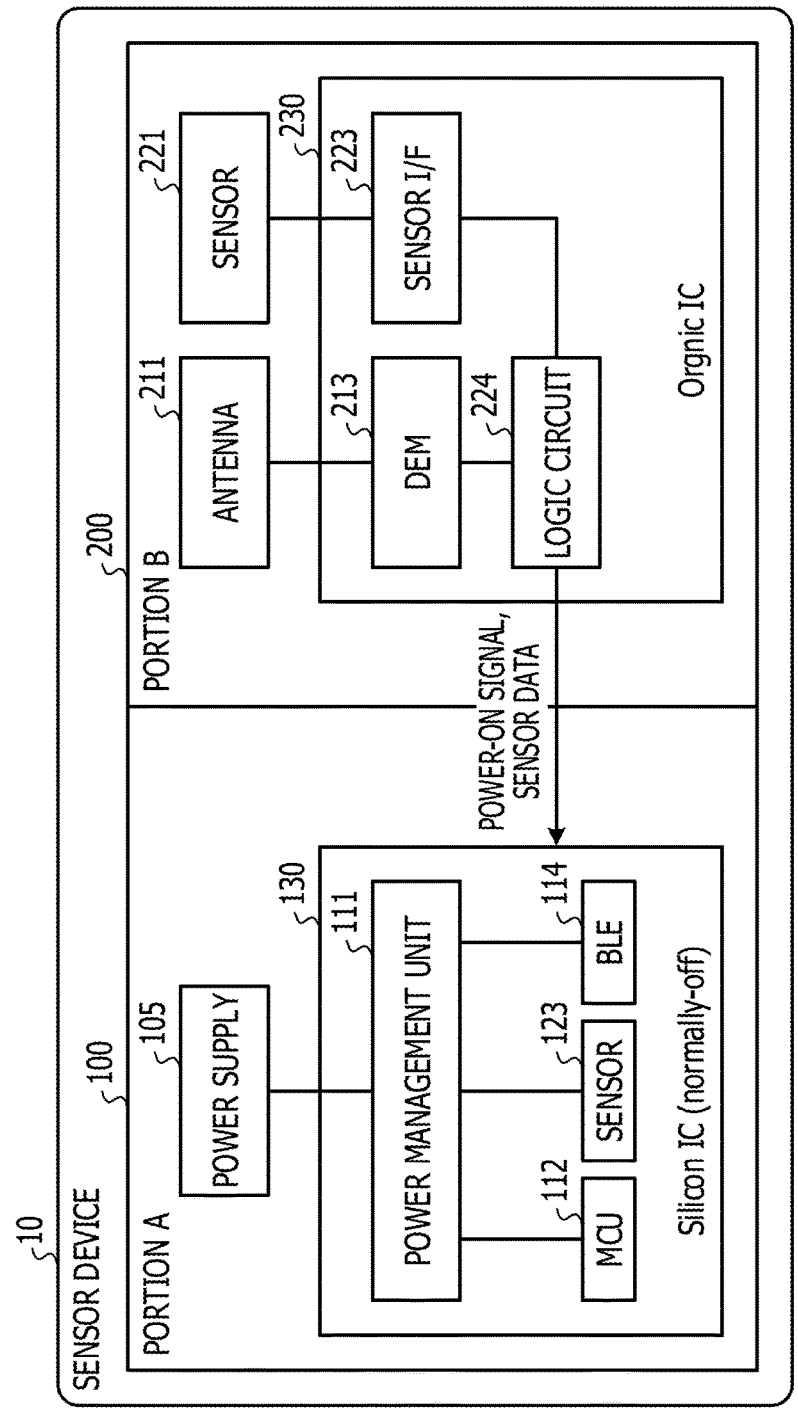
FIG. 4 is a view illustrating still another exemplary operation form of the sensor device of FIG. 1.

FIG. 4 is a view illustrating still another exemplary operation of the sensor device 10 of FIG. 1. The configuration of FIG. 4 is a combination of FIGS. 2 and 3. The first portion 100 of the sensor device 10 includes the power supply 105 and a control module 130 formed of a silicon IC and being in the normally-off state. The control module 130 includes the power management unit 111, the MCU 112, a sensor 123, and the communication module 114. The second portion 200 includes the antenna 211, the sensor 221, and the operation start trigger circuit 230 formed of an organic IC. The operation start trigger circuit 230 includes the demodulator 213 coupled to the antenna 211, a sensor interface circuit 223 coupled to the sensor 221, and a logic circuit 234 coupled to the demodulator 213 and the sensor interface circuit 223.

The logic circuit 234 outputs a power-on signal to the first portion 100 when a signal is input from the terminal 20 (see, e.g., FIG. 2) or when a measurement value exceeding a predetermined level is detected by the sensor 221. When a measurement value exceeding a predetermined level is detected by the sensor 221, sensor data is also supplied to the first portion 100.

In the first portion 100, when the power supply 105 is turned on, the sensor 123 measures an object different from that measured by the sensor 221. The measurement result by the sensor 123 and the measurement result by the sensor 221 are transmitted to the terminal 20 by the communication module 114.

In any of the configurations of FIGS. 2 to 4, the first portion 100 including an inorganic semiconductor IC such as a silicon IC and the second portion 200 easily manufactured using an inexpensive organic material by the printing method are provided to be separable from each other. By allowing the first portion 100 to be repeatedly used and the second portion to be replaceable or disposable, the utility aspect or situation of the sensor device 10 may be expanded. Since the first portion 100 starts its operation by the trigger signal (e.g., the power-on signal) output from the operation start trigger circuit of the second portion 200, the power consumption may be reduced.

Figure 5:
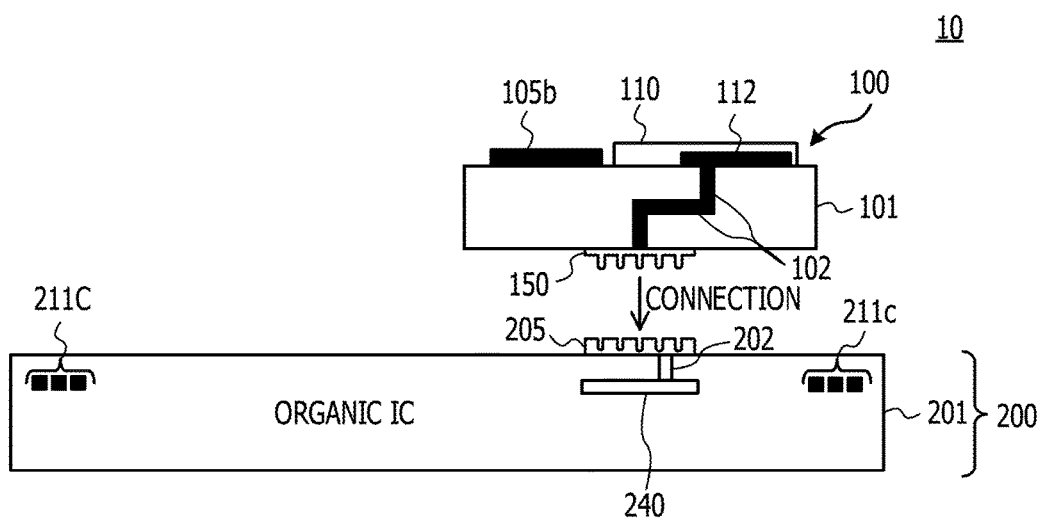
FIG. 5 illustrates an exemplary separable connection configuration between a first portion and a second portion.

FIG. 5 illustrates an exemplary separable connection between the first portion 100 and the second portion 200. In the example of FIG. 5, a connection means for a physical contact, such as a connector pin, is used. The first portion 100 is implemented by, for example, a silicon IC and a battery that are mounted on a printed board 101. The control module 110 including the MCU 112 is formed of a silicon IC, and a coin battery 105b is used as the power supply 105. A wiring 102 including a via plug is formed in the printed board 101, and a connector 150 is disposed on the surface of the printed board 101 that is coupled to the second portion 200. The connector 150 is, for example, a thin flexible printed circuit (FPC) connector.

The second portion 200 includes an operation start trigger circuit 240 formed of an organic IC in the flexible board 201, and a coil type antenna wiring 211c. A connector 205 is disposed on the surface of the second portion 200 that is coupled to the first portion 100, and the operation start trigger circuit 240 and the connector 205 are coupled to each other by a via contact 202 or the like. The connector 205 is, for example, a thin FPC connector.

For use, the first portion 100 and the second portion 200 are coupled to each other by physical engagement between the connectors 150 and 205. The first portion 100 has a size of, for example, 20 mm×30 mm. The second portion 200 has a size of, for example, 54 mm×85 mm. The connectors 150 and 205 are thin connectors each having a mounting height of 1 mm or less. The second portion 200 may be replaced by releasing the engagement between the connectors 150 and 205. Thus, the first portion 100 including the main circuits may be repeatedly used, and the inexpensive second portion 200 may be used as a disposable module.

Figure 6:
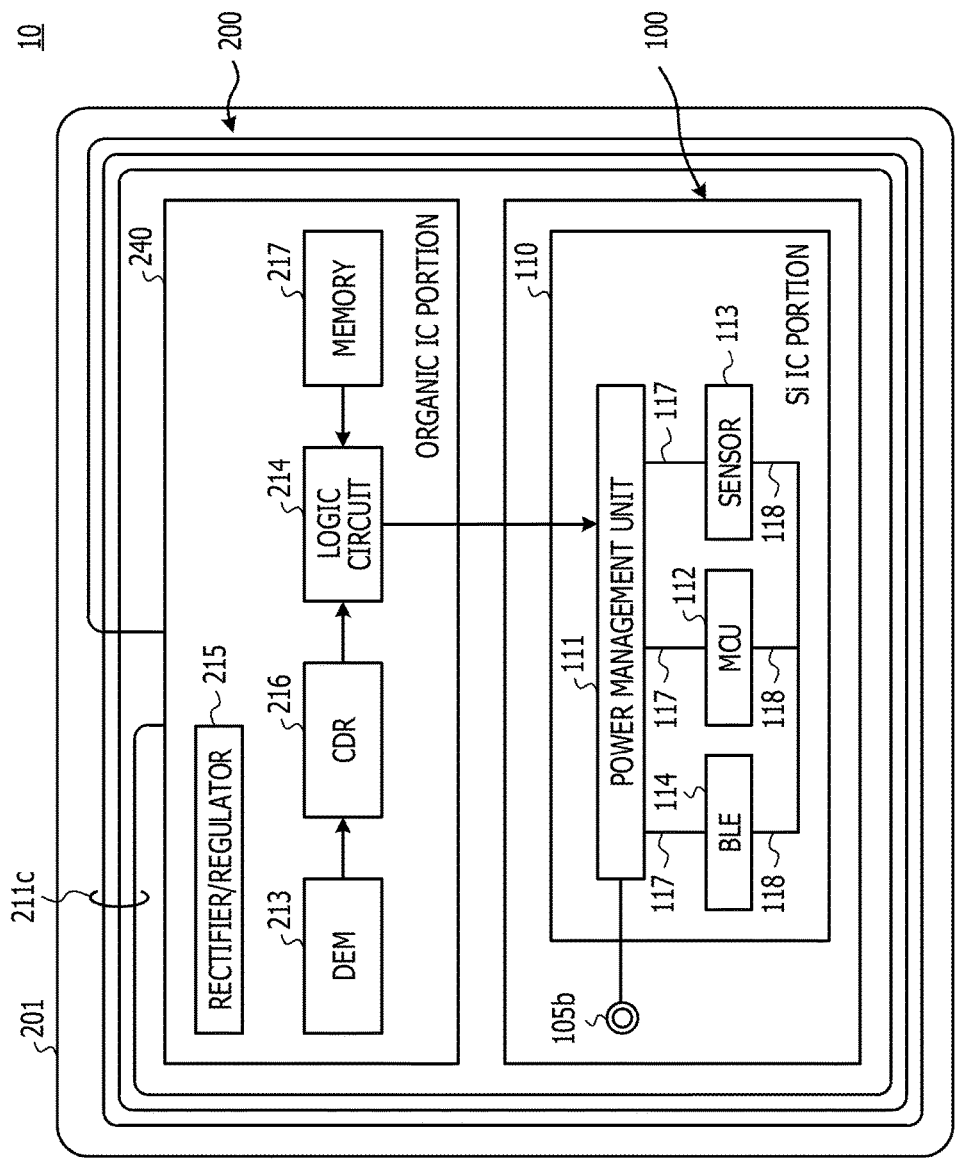
FIG. 6 is a schematic plan view illustrating the configuration of FIG. 5.

FIG. 6 is a schematic plan view illustrating the sensor device 10 integrated in the connection form of FIG. 5. It is noted that FIG. 6 does not illustrate the exact plane arrangement of the sensor device 10 and is merely a schematic view for explaining an exemplary operation of the sensor device 10. The second portion 200 includes the antenna wiring 211c arranged in a coil shape along the outer periphery of the flexible board 201. The antenna wiring 211c is coupled to the operation start trigger circuit 240 formed of an organic IC. A part of a radio NFC signal from the terminal 20a (see, e.g., FIG. 2) that is received by the antenna wiring 211c is rectified and smoothed by a rectifier/regulator 215 and used as a power for operating the operation start trigger circuit 240. Another part of the radio NFC signal from the terminal 20a is demodulated by the demodulator 213, and ID information recovered by a clock data recovery (CDR) 216 is input to the logic circuit 214. The logic circuit 214 reads ID information of the sensor device 10 from the memory 217 and compares the ID information of the sensor device 10 with the received ID information. When the ID information of the sensor device 10 and the received ID information are consistent with each other, the logic circuit 214 outputs a trigger signal (e.g., a power-on signal) to the first portion 100.

The power-on signal supplied from the second portion 200 is input to the power management part 111 of the first portion 100. The power management unit 111 supplies the power supplied from the coin battery 105b, to the MCU 112, the sensor 113, and the communication module 114 through power supply lines 117. The MCU 112, the sensor 113, and the communication module 114 are coupled to each other by a signal bus 118. The MCU 112 converts an output value of the sensor 113 into a format suitable for the processing by the communication module 114 and causes the communication module 114 to transmit the converted output value.

The first portion 100 and the second portion 200 are separably coupled to each other, and the first portion 100 is operated by the trigger signal from the second portion 200, so that the power consumption of the sensor device 10 may be reduced.

Figure 7:
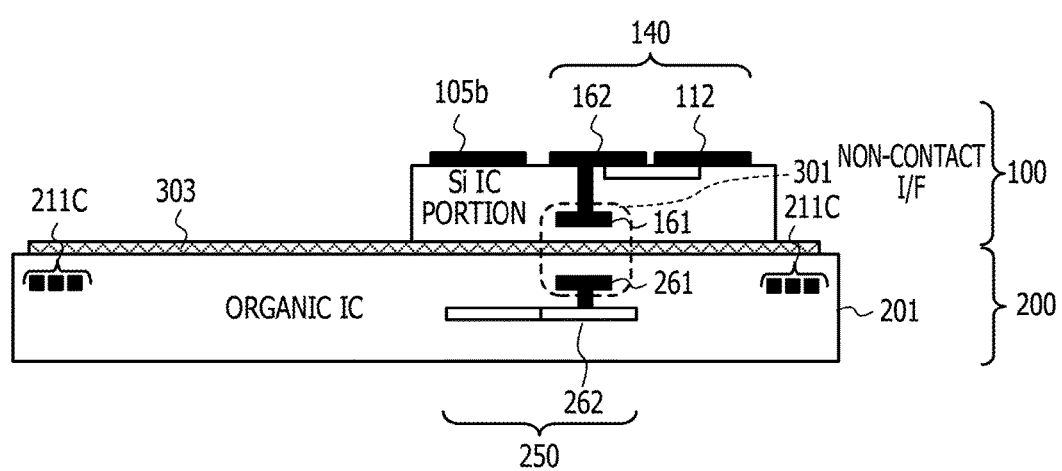
FIG. 7 illustrates another exemplary separable connection configuration between the first portion and the second portion.

FIG. 7 illustrates another exemplary separable connection between the first portion 100 and the second portion 200. In the example of FIG. 7, a non-contact connection means such as an electromagnetic field coupling is used. The first portion 100 includes the control module 140 formed of, for example, a silicon IC, and the coin battery 105b as a power supply. The control module 140 includes the MCU 112 and a non-contact interface circuit 162. The non-contact interface circuit 162 is coupled to a metal wiring 161 disposed near the surface of the first portion 100 that is coupled to the second portion 200.

The second portion 200 includes an operation start trigger circuit 250 formed of an organic IC in the flexible board 201, and the coil type antenna wiring 211c. The operation start trigger circuit 250 includes a non-contact interface circuit 262. The non-contact interface circuit 262 is coupled to the metal wiring 261 disposed near the surface of the second portion 200 that is coupled to the first portion 100. A non-contact interface 301 is formed by the metal wirings 161 and 261 facing with each other.

The first portion 100 and the second portion 200 may be adhered to each other by an adhesive layer 303. The adhering force of the adhesive layer 303 may be sufficient to the extent that the first portion 100 is securely held on the second portion, and may be easily separated from the second portion with the fingertips. In the state where the first portion 100 is adhered to the second portion 200, a signal may be transmitted and received in the non-contact manner by the electromagnetic field coupling between the metal wirings 161 and 261. The adhesive layer 303 may be formed on the entire surface of the second portion 200 that is coupled to the first portion 100. In this case, the sensor device 10 may be attached to the skin of a user or the wall surface of a building by the adhesive layer 303. In this configuration as well, the first portion 100 including the main circuits may be repeatedly used, and the inexpensive second portion 200 may be used as a disposable module.

Figure 8A:
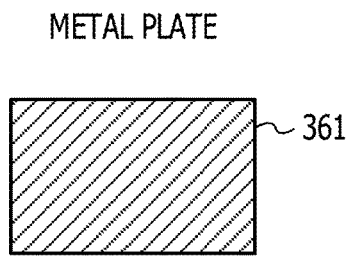
FIGS. 8A and 8B are views illustrating an example of a metal wiring that performs a non-contact connection.
Figure 8B:
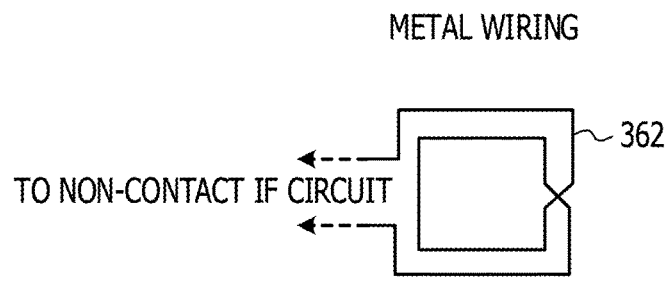

FIGS. 8A and 8B illustrate an example of the metal wirings 161 and 261 forming the non-contact interface 301. In FIG. 8A, a pair of metal plates 361 facing with each other is used. In this case, a signal is transmitted and received by an electromagnetic field capacitive coupling. In FIG. 8B, a pair of wiring coils 362 facing with each other is used. The number of turns of the wiring coil 362 is arbitrary. However, when the number of the turns is 2 or more, a two-layer wiring is used for crossing. The opposite ends of the wiring coil 362 are coupled to their corresponding non-contact interface circuits 162 and 262. In this configuration, a signal is transmitted and received by an inductive coupling.

Figure 9:
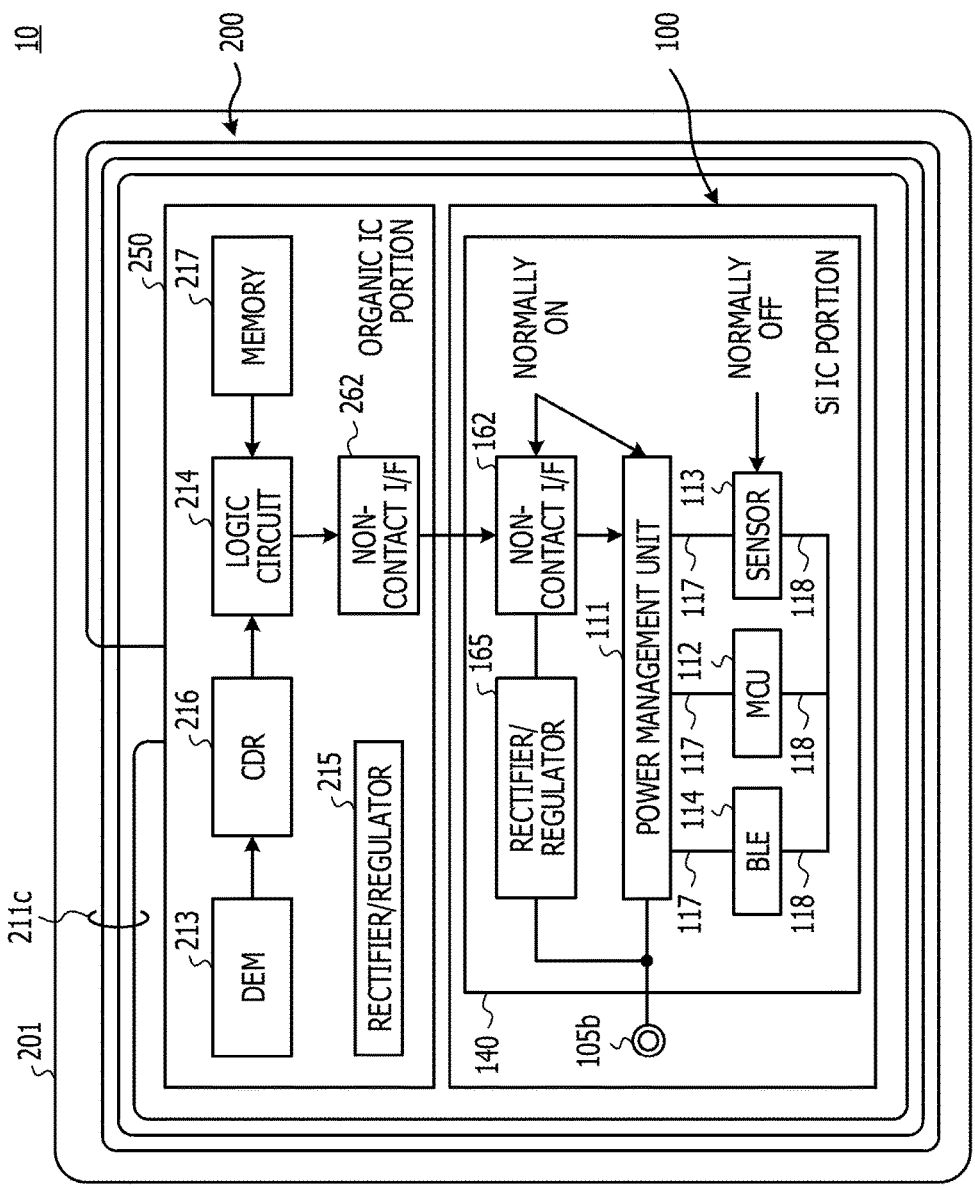
FIG. 9 is a schematic plan view illustrating the configuration of FIG. 7.

FIG. 9 is a schematic plan view illustrating the sensor device 10 integrated in the connection form of FIG. 7. It is noted that FIG. 9 does not illustrate the exact plane arrangement of the sensor device 10 and is merely a schematic view for explaining an exemplary operation of the sensor device 10. The second portion 200 includes the antenna wiring 211c disposed in a coil shape along the outer periphery of the flexible board 201. The antenna wiring 211c is coupled to the operation start trigger circuit 250 formed of an organic IC. A part of a radio NFC signal from the terminal 20a (see, e.g., FIG. 2) that is received by the antenna wiring 211c is rectified and smoothed by the rectifier/regulator 215 and used as a power for operating the operation start trigger circuit 250.

Another part of the radio NFC signal from the terminal 20a is demodulated by the demodulator 213, and ID information recovered by the clock data recovery (CDR) 216 is input to the logic circuit 214. The logic circuit 214 reads ID information of the sensor device 10 from the memory 217 and compares the ID information of the sensor device 10 with the received ID information. When the ID information of the sensor device 10 and the received ID information are consistent with each other, the logic circuit 214 outputs a trigger signal (e.g., a power-on signal) to the non-contact interface circuit 262.

The another part of the radio signal from the terminal 20a may be input to the non-contact interface circuit 262 without passing through the demodulator 213, so as to supply a high frequency signal to the second part 200 in the non-contact manner. The high frequency signal may be used for charging the coin battery 105b of the first portion 100.

The power-on signal output from the non-contact interface circuit 262 of the second portion 200 is propagated to the non-contact interface circuit 162 of the first portion 100 by the electromagnetic field coupling and input to the power management part 111. The power management unit 111 supplies the power supplied from the coin battery 105b, to the MCU 112, the sensor 113, and the communication module 114 by the power supply lines 117. The MCU 112, the sensor 113, and the communication module 114 are coupled to each other by the signal bus 118. The MCU 112 converts an output value of the sensor 113 into a format suitable for the processing by the communication module 114 and causes the communication module 114 to transmit the converted output value. Apart from the power-on signal, the high frequency signal received by the non-contact interface circuit 162 may be rectified and smoothed by the rectifier/regulator 165 and stored in the coin battery 105b.

In the control module 140 of the first portion 100, the MCU 112, the sensor 113, and the communication module 114 are normally turned off, and are turned on by the power management part 111 at the time of receiving the power-on signal from the second portion 200. Meanwhile, the power management unit 111, the non-contact interface circuit 162, and the rectifier/regulator 165 are normally turned on in order to receive a signal or power by the electromagnetic field coupling. Even though the control module 140 includes the normally-on portions, a decrease of the remaining amount of the coin battery 105b may be suppressed since the power may be supplied from the second portion 200.

In the configuration of FIG. 9, the first portion 100 and the second portion 200 are separable from each other, and the first portion 100 is operated by the trigger signal from the second portion 200 so that the power consumption of the sensor device 10 is reduced. Further, since the high frequency power supplied from the second portion 200 in the non-contact manner may be charged to the coin battery 105b, the power may be effectively used.

Figure 10:
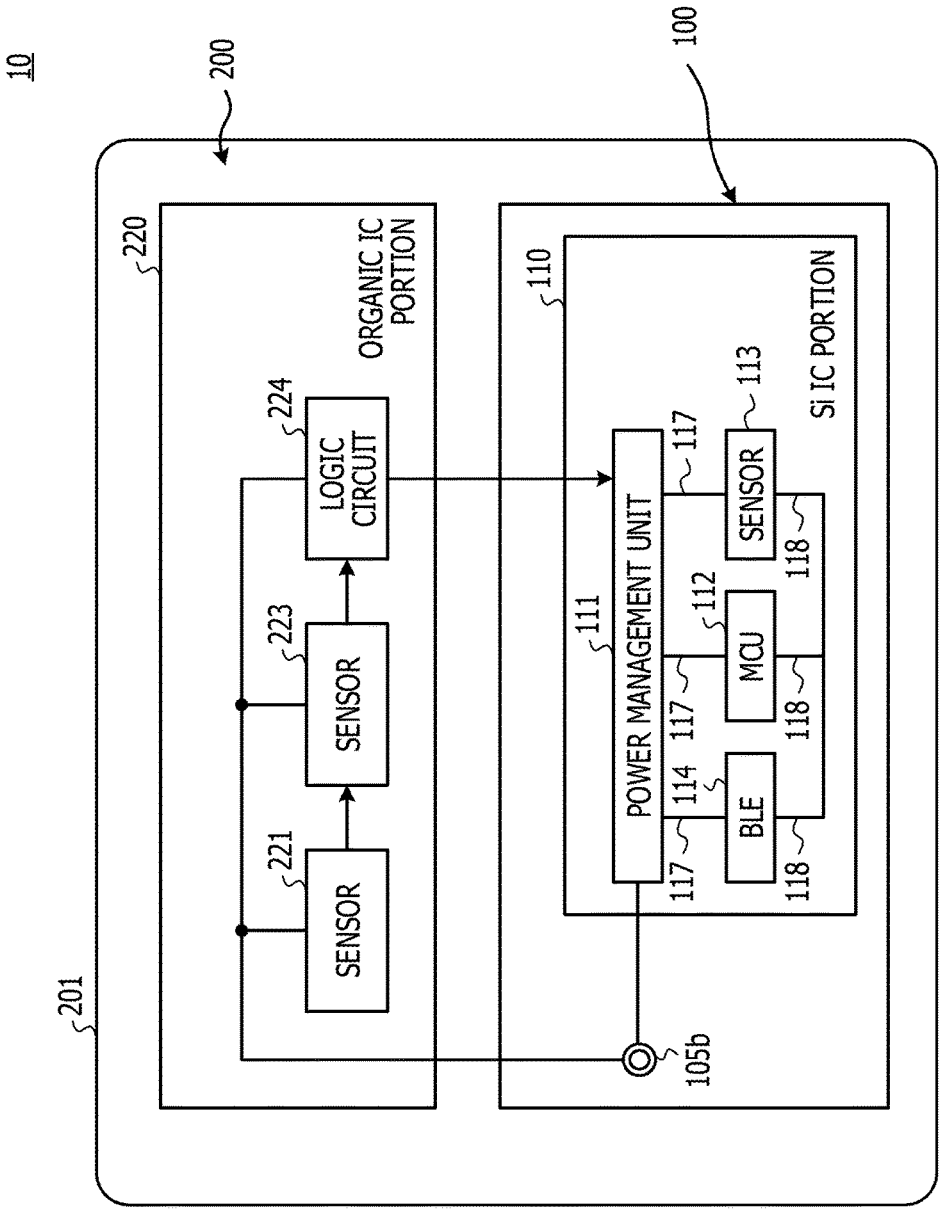
FIG. 10 is a schematic plan view illustrating a modification of the sensor device 10 integrated in the connection form of FIG. 5 or 7.

FIG. 10 is a schematic plan view illustrating a modification of the sensor device 10 integrated in the connection form of FIG. 5 or 7. In FIG. 10, the power supply to the operation start trigger circuit 220 of the second portion 200 is performed from the coin battery 105b of the first portion 100. The power supply from the first portion 100 to the second portion 200 is implemented by the set of the connectors 150 and 205 in FIG. 5 or the non-contact interface 301 in FIG. 7. The sensor 221 of the second portion 200 is operated by the power supplied from the coin battery 105b. When the output of the sensor 221 exceeds a predetermined level, a trigger signal (e.g., a power-on signal) is output from the logic circuit 224 to the power management unit 111 of the first portion 100. Sensor information acquired by the sensor 221 is supplied to the first portion 100 simultaneously with the trigger signal or after a predetermined timing. The trigger signal and the sensor information are supplied to the first portion 100 by the connection means of FIG. 5 or 7. The control module 110 is operated by the input of the trigger signal, and the power is supplied to each of the units of the control module 110 from the coin battery 105b. The sensor 113 starts the sensing operation to acquire sensor information. The sensor information acquired by the sensor 113 and the sensor information acquired by the sensor 221 are transmitted from the communication module 114 to the terminal 20b (see, e.g., FIG. 3).

Figure 11:
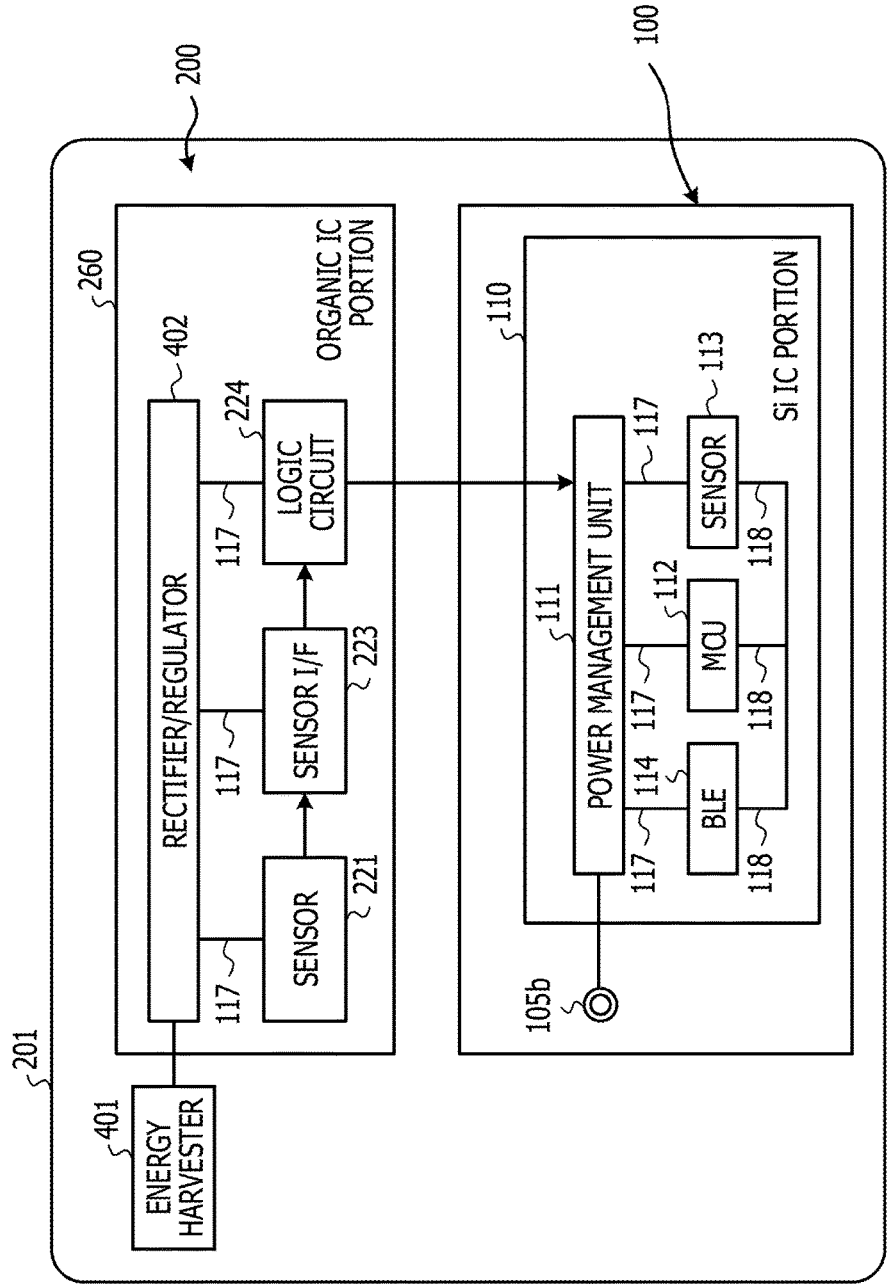
FIG. 11 is a schematic plan view illustrating another modification of the sensor device 10 integrated in the connection form of FIG. 5 or 7.

FIG. 11 is a schematic plan view illustrating another modification of the sensor device 10 integrated in the connection form of FIG. 5 or 7. In FIG. 11, an energy harvester 401 formed in the second portion 200 supplies a power to the operation start trigger circuit 260 formed of an organic IC. The energy harvester 401 is implemented with, for example, a solar cell of an organic thin film or a piezoelectric element formed of an organic piezoelectric material. An AC power supplied from the energy harvester 401 is rectified and smoothed by the rectifier/regulator 402 and supplied to the sensor 221, the sensor interface circuit 223, and the logic circuit 224 by the power supply lines 117.

When the output of the sensor 221 exceeds a predetermined level, a trigger signal (e.g., a power-on signal) is output from the logic circuit 224 to the power management unit 111 of the first portion 100. Sensor information acquired by the sensor 221 is supplied to the first portion 100 simultaneously with the trigger signal or after a predetermined timing. The trigger signal and the sensor information are supplied to the first portion 100 by the connection means of FIG. 5 or 7. The control module 110 is operated by the input of the trigger signal, and a power is supplied to each of the units of the control module 110 from the coin battery 105b. The sensor 113 starts the sensing operation to acquire sensor information. The sensor information acquired by the sensor 113 and the sensor information acquired by the sensor 221 are transmitted from the communication module 114 to the terminal 20b (see, e.g., FIG. 3).

Figure 12:
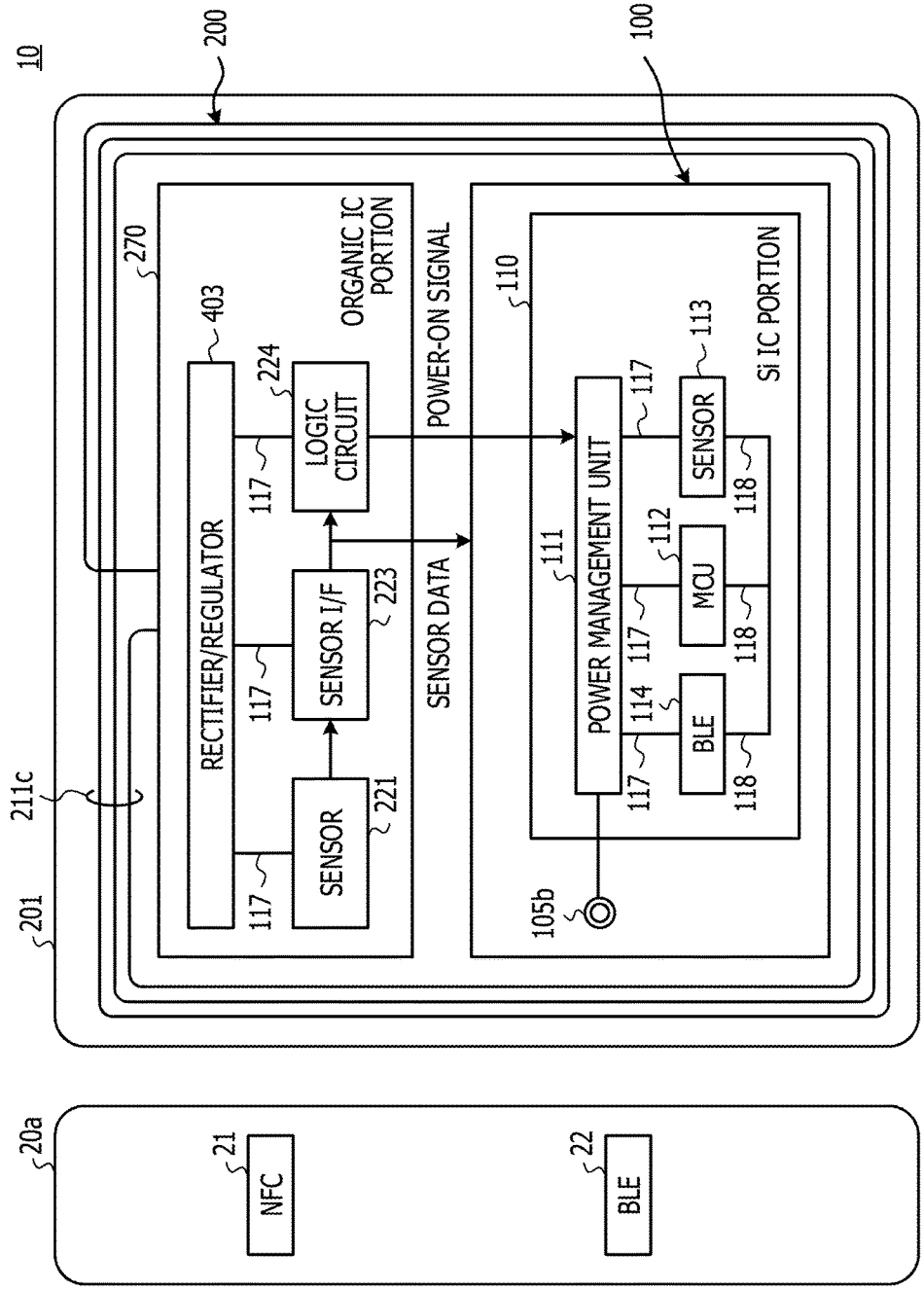
FIG. 12 is a schematic plan view illustrating still another modification of the sensor device 10 integrated in the connection form of FIG. 5 or 7.

FIG. 12 is a schematic plan view illustrating still another modification of the sensor device 10 integrated in the connection form of FIG. 5 or 7. In FIG. 12, a power is supplied to the operation start trigger circuit 270 formed of an organic IC by the NFC signal from the terminal 2a. The operation start trigger circuit 270 is coupled to the coil type antenna wiring 211c. The NFC signal from the terminal 2a is propagated to the antenna wiring 211c by the inductive coupling. The NFC signal is rectified and smoothed by the rectifier/regulator 403 and supplied to the sensor 221, the sensor interface circuit 223, and the logic circuit 224 by the power supply lines 117.

When the output of the sensor 221 exceeds a predetermined level, a trigger signal (e.g., a power-on signal) is output from the logic circuit 224 to the power management unit 111 of the first portion 100. Sensor information acquired by the sensor 221 is supplied to the first portion 100 simultaneously with the trigger signal or after a predetermined timing. The trigger signal and the sensor information are supplied to the first portion 100 by the connection means of FIG. 5 or 7. The control module 110 is operated by the input of the trigger signal, and a power is supplied to each of the units of the control module 110 from the coin battery 105b. The sensor 113 starts the sensing operation to acquire sensor information. The sensor information acquired by the sensor 113 and the sensor information acquired by the sensor 221 are transmitted from the communication module 114 to the BLE module 22 of the terminal 20a.

In any of the configurations of FIGS. 10 to 12, the first portion 100 and the second portion 200 are separable from each other, and the first portion 100 is operated by the trigger signal from the second portion 100, so that the power consumption of the sensor device 10 is reduced. In FIG. 10, the second portion 200 is operated by using the power supply of the first portion 100. In FIGS. 11 and 12, the power is generated by using the energy harvester of the second portion or the high frequency signal from the terminal 20a. Thus, the power may be effectively used.

In the above-described embodiment, since the first portion 100 including the main portions of the sensor device 10 is reusable, and the second portion manufactured at a low cost by using a flexible organic board is disposable, the utility situation of the sensor device 10 may be expanded. The second portion 200 formed of an organic semiconductor material has a small experimental load. Since the second portion 200 may be separated at the time desired by the user, maintenance costs may be reduced. By using the cooperative operation with the terminals 20a and 20b, the security may be maintained.

The above-described configurations are merely exemplary, and various modifications and improvements thereof are included in the present disclosure. The standard of the short distance wireless communication is not limited to the BLE, and other communication standards such as ZigBee (registered trademark) may be used. Also, the standard of the near field (non-contact) communication is not limited to the NFC, and other standards such as FeliCa (registered trademark) and MIFARE (registered trademark) may be used. Without being limited to the one set of the connectors 150 and 205, a plurality of sets of connectors may be provided according to use. Also, the number of the non-contact interfaces 301 is not limited to one. The connection means that transmits/receives a power between the first portion 100 and the second portion 200, and the connection means that is used for the supply of the trigger signal from the second portion 200 to the first portion 100 may be provided to be separate from each other.

All examples and conditional language recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority and inferiority of the disclosure. Although the embodiment(s) of the present disclosure has (have) been described in detail, it should be understood that the various changes, substitutions, and alterations could be made hereto without departing from the spirit and scope of the disclosure.

What is claimed is:

1. A sensor device that detects information of a user carrying a terminal device, the sensor device comprising:
a first portion that is formed of an inorganic semiconductor material, includes a control module, and is reusable;
a second portion that is formed of an organic material and coupled to the first portion in such a way that the second portion is either capable of being attached to or capable of being detached from the first portion, the second portion including an operation start trigger circuit that generates a trigger signal for operating the first portion; and a sensor that is disposed in at least one of the first and second portions and configured to detect the information of the user of the terminal device, wherein the sensor device is capable of performing a pairing with the terminal device using a first wireless communication protocol, and wherein when a radio signal is transmitted to the second portion from the terminal device paired with the sensor device through the first wireless communication protocol, the operation start trigger circuit of the second portion compares identification information of the radio signal with identification information of the sensor device, and when the identification information of the radio signal and the identification information of the sensor device are consistent with each other, the operation start trigger circuit of the second portion generates the trigger signal to operate the first portion.

2. The sensor device according to claim 1, wherein the first portion starts an operation when the trigger signal is input from the second portion.

3. The sensor device according to claim 2, wherein the sensor is disposed in the first portion and starts sensing by the trigger signal input from the second portion.

4. The sensor device according to claim 2, wherein the sensor is disposed in the second portion, and the operation start trigger circuit generates the trigger signal when a value detected by the sensor exceeds a level, and supplies the trigger signal and sensor information detected by the sensor to the first portion.

5. The sensor device according to claim 4, wherein the first portion includes a second sensor, and the second sensor starts an operation when the trigger signal is received from the second portion.

6. The sensor device according to claim 4, wherein a coil type antenna is additionally disposed in the second portion, and when the radio signal is transmitted to the coil type antenna of the second portion from the terminal device, the operation start trigger circuit generates the trigger signal.

7. The sensor device according to claim 2, wherein the first portion includes a power supply, and a supply of power from the power supply to the control module of the first portion is not performed while no trigger signal is input from the second portion.

8. The sensor device according to claim 1, wherein the first portion including a first connector and the second portion including a second connector are coupled to each other by an engagement between the first connector of the first portion and the second connector of the second portion.

9. The sensor device according to claim 1, wherein the first portion and the second portion are coupled to each other by a non-contact connection including an electromagnetic field coupling.

10. The sensor device according to claim 9, wherein the second portion includes a coil type antenna, and when the radio signal is transmitted through the first wireless communication protocol from the terminal device to the coil type antenna of the second portion, the second portion transmits the trigger signal generated by the operation start trigger circuit to the first portion by the non-contact connection such that the first portion generates a power by a power supply to use the power for an operation of the control module.

11. The sensor device according to claim 1, wherein the second portion includes a coil type antenna, and when the radio signal is received from the terminal device to the coil type antenna of the second portion through the first wireless communication protocol, the second portion is operated by using a power generated from the radio signal.

12. The sensor device according to claim 1, wherein the first portion includes a power supply, and the second portion is operated by using power from the power supply.

13. The sensor device according to claim 1, wherein the second portion includes an energy harvester and is operated by using energy generated in the energy harvester.

14. The sensor device according to claim 1, wherein the first portion includes a communication module, and the communication module of the first portion conducts a wireless communication according to a second wireless communication protocol such that sensor information acquired by the sensor is transmitted to the terminal device, the second wireless communication protocol is a short distance wireless protocol having a longer range than the first wireless communication protocol.

* * * * *